(12) United States Patent
Huang et al.

(10) Patent No.: US 10,033,406 B2
(45) Date of Patent: Jul. 24, 2018

(54) METHOD FOR PERFORMING PARALLEL CODING WITH ORDERED ENTROPY SLICES, AND ASSOCIATED APPARATUS

(71) Applicant: MEDIATEK INC., Hsin-Chu (TW)

(72) Inventors: Yu-Wen Huang, Taipei (TW); Xun Guo, Beijing (CN)

(73) Assignee: HFI Innovation Inc., Hsinchu County (TW)

( * ) Notice: Subject to any disclaimer, the term of this patent is extended or adjusted under 35 U.S.C. 154(b) by 65 days.

(21) Appl. No.: 13/655,466

(22) Filed: Oct. 19, 2012

(65) Prior Publication Data

US 2013/0044806 A1 Feb. 21, 2013

Related U.S. Application Data

(63) Continuation of application No. 12/464,090, filed on May 11, 2009.

(60) Provisional application No. 61/119,394, filed on Dec. 3, 2008, provisional application No. 61/207,888, filed on Apr. 14, 2009.

(51) Int. Cl.
| | |
|---|---|
| *H04N 19/91* | (2014.01) |
| *H04N 19/174* | (2014.01) |
| *H04N 19/436* | (2014.01) |
| *H03M 7/00* | (2006.01) |
| *H03M 7/40* | (2006.01) |

(52) U.S. Cl.
CPC ........ *H03M 7/4006* (2013.01); *H04N 19/174* (2014.11); *H04N 19/436* (2014.11); *H04N 19/91* (2014.11)

(58) Field of Classification Search
None
See application file for complete search history.

(56) References Cited

U.S. PATENT DOCUMENTS

| | | | |
|---|---|---|---|
| 2003/0189982 A1* | 10/2003 | MacInnis | ................ 375/240.24 |
| 2006/0232452 A1 | 10/2006 | Cha | |
| 2008/0074426 A1* | 3/2008 | Stein et al. | .................. 345/502 |
| 2008/0089412 A1* | 4/2008 | Ugur et al. | ............. 375/240.12 |
| 2008/0253463 A1* | 10/2008 | Lin et al. | ................ 375/240.25 |
| 2009/0245349 A1* | 10/2009 | Zhao et al. | ............. 375/240.03 |
| 2010/0098155 A1 | 4/2010 | Demircin | |

\* cited by examiner

*Primary Examiner* — Edemio Navas, Jr.
(74) *Attorney, Agent, or Firm* — Winston Hsu

(57) ABSTRACT

A method for performing parallel coding with ordered entropy slices includes: providing a plurality of entropy slices to a plurality of processing elements, wherein each entropy slice includes a plurality of blocks; initializing CABAC states of a current entropy slice as the CABAC states of a previous entropy slice after processing $D_B$ blocks of the previous entropy slice. $D_B$ is a positive integer.

14 Claims, 12 Drawing Sheets

H=1

H=2

H=3

METHOD FOR PERFORMING PARALLEL CODING WITH ORDERED ENTROPY SLICES, AND ASSOCIATED APPARATUS

CROSS REFERENCE TO RELATED APPLICATIONS

This application is a continuation application of pending U.S. patent application Ser. No. 12/464,090, filed May 11, 2009, the entirety of which is incorporated by reference herein. The U.S. patent application Ser. No. 12/464,090 claims the benefit of U.S. Provisional Application No. 61/119,394, which was filed on Dec. 3, 2008, and is entitled "Ordered Entropy Slices for Parallel CABAC". The U.S. patent application Ser. No. 12/464,090 further claims the benefit of U.S. Provisional Application No. 61/207,888, which was filed on Apr. 14, 2009, and is entitled "Method for Performing Parallel CABAC Processing with Ordered Entropy Slices, and Associated Apparatus".

BACKGROUND

The present invention relates to video encoding and decoding, and more particularly, to a method and an associated apparatus for performing parallel encoding and decoding with ordered entropy slices.

Context-based Adaptive Binary Arithmetic Coding (CABAC) is a powerful entropy coding tool and has been adopted in compression standards. However, conventional sequential CABAC is a bottleneck for parallel processing due to the nature of its serial order of bit-level processing. Recently, parallelization of CABAC has been a topic under discussion since parallel CABAC can greatly accelerate the coding procedures when adopting a multi-core processor.

According to a decoding flow of a prior art for parallel CABAC, referring to A. Segall and J. Zhao, "Entropy slices for parallel entropy decoding," ITU-T SGI 6/Q.6 Doc. COM16-C405, Geneva, CH, April 2008, and J. Zhao and A. Segall, "New results using entropy slices for parallel decoding," ITU-T SGI 6/Q.6 Doc. VCEG-AI32, Berlin, Germany, July, 2008, context formation cannot be applied across entropy slices, which results in loss of compression efficiency in comparison with the conventional sequential CABAC. Moreover, during CABAC parsing of all macroblocks, prediction residues and motion vector differences of the entire picture have to be stored and accessed for further decoding. As a result, parsing may be accelerated by parallel processing; however, significant side effects are introduced, as stated in X. Guo, Y. W. Huang, and S. Lei, "Ordered entropy slices for parallel CABAC," ITU-T SGI 6/Q.6 Doc. VCEG-AK25, Yokohama, Japan, April, 2009.

More particularly, for software or hardware implementations, both the buffer size and data access for prediction residues and motion vector differences of a picture are exceedingly large. In addition, when the buffer is too large to be implemented as an on-chip memory, the buffer will be implemented as an off-chip memory. As a result, the processing speed will be severely decreased due to that the off-chip memory access speed is typically 10 times slower than the on-chip memory, and the power consumption will be greatly increased due to that the off-chip memory power dissipation is typically 10 times larger than the on-chip memory.

SUMMARY

It is therefore an objective of the claimed invention to provide a method for performing parallel CABAC with ordered entropy slices, and to provide an associated apparatus, in order to solve the above-mentioned problems. Moreover, the claimed invention can parallelize not only CABAC but also the rest of video coding in a way that prior macroblock (MB) information stored for encoding or decoding subsequent macroblocks (MBs) is significantly reduced and can be accommodated to an on-chip memory.

An exemplary embodiment of a method for performing parallel coding with ordered entropy slices comprises: providing a plurality of entropy slices to a plurality of processing elements with a causal criterion on processing order, wherein each entropy slice comprises a plurality of MBs; and respectively performing a coding procedure for the plurality of entropy slices according to the causal criterion, so that at least a portion of the processing elements can work in parallel during at least a portion of processing time.

An exemplary embodiment of an apparatus for performing parallel coding with ordered entropy slices comprises: a plurality of processing elements; and a controller. The processing elements are arranged to process a plurality of entropy slices, wherein each entropy slice comprises a plurality of MBs. In addition, the controller is arranged to make the plurality of entropy slices comply with a causal criterion on processing order. Additionally, under control of the controller, the processing elements respectively start to perform a coding procedure for the plurality of entropy slices according to the causal criterion, so that at least a portion of the processing elements can work in parallel during at least a portion of processing time.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
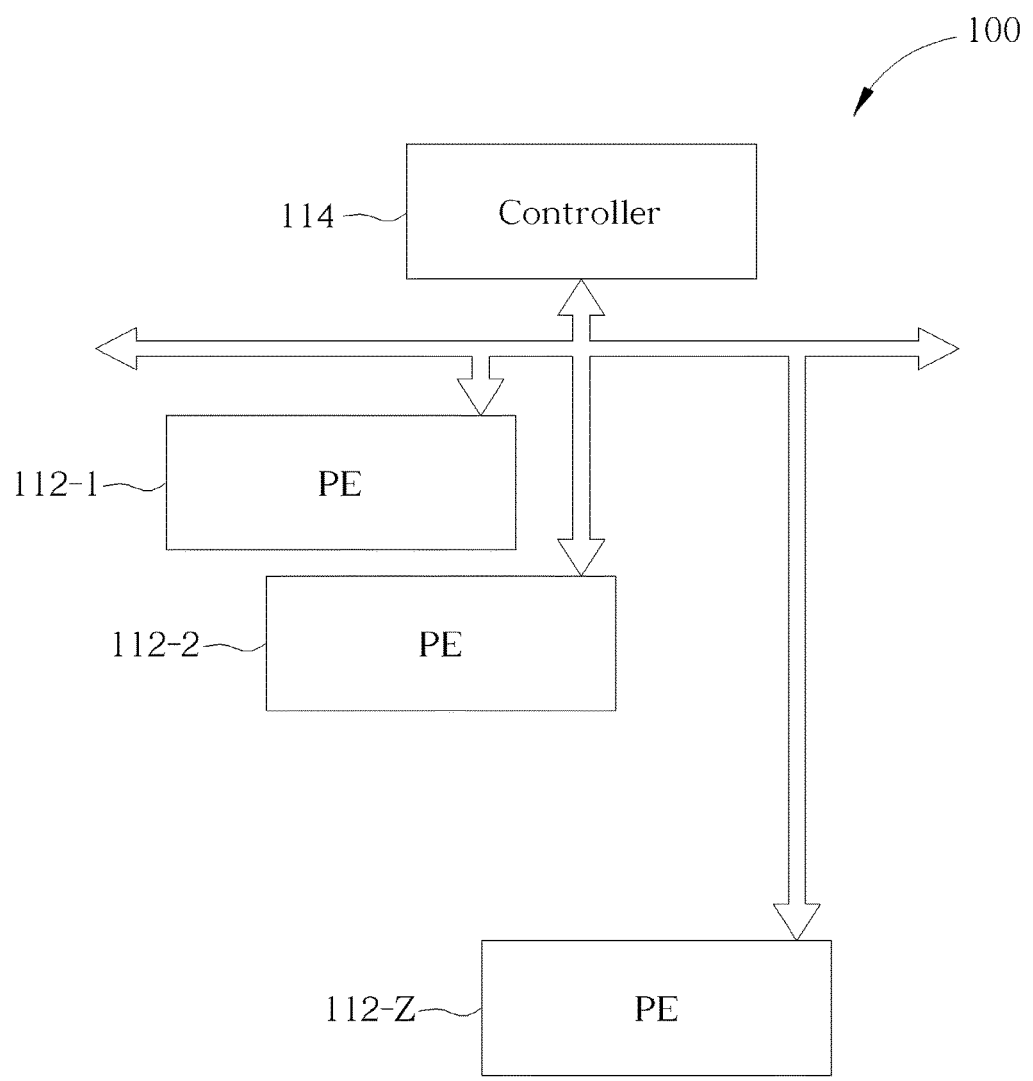
FIG. 1 is a diagram of an apparatus for performing parallel coding with ordered entropy slices according to a first embodiment of the present invention.

Please refer to FIG. 1, which illustrates a diagram of an apparatus 100 for performing parallel coding with ordered entropy slices according to a first embodiment of the present invention, where the parallel coding can be parallel encoding or parallel decoding. As shown in FIG. 1, the apparatus 100 comprises a plurality of processing elements 112-1, 112-2, . . . , and 112-Z (labeled "PE") and a controller 114, where a bus is in-between for communication between the controller 114 and the processing elements 112-1, 112-2, . . . , and 112-Z.

In general, the apparatus 100 of this embodiment can perform video processing such as video encoding and video decoding. In particular, the processing elements 112-1, 112-2, . . . , and 112-Z are arranged to be capable of processing a plurality of entropy slices in parallel, where each entropy slice comprises a plurality of MBs. In addition, the controller 114 is arranged to control the operations of the processing elements 112-1, 112-2, . . . , and 112-Z. Implementation details are further explained according to FIG. 2.

Figure 2:
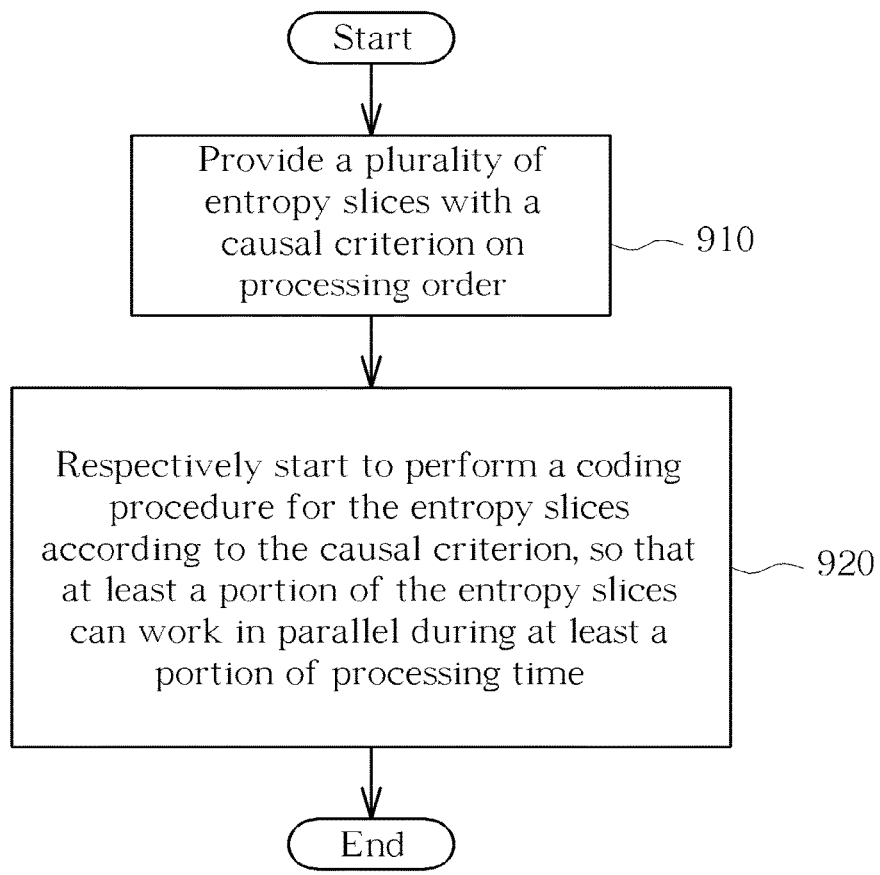
FIG. 2 is a flowchart of a method for performing parallel coding with ordered entropy slices according to one embodiment of the present invention.

FIG. 2 is a flowchart of a method for performing parallel coding with ordered entropy slices according to one embodiment of the present invention. The embodiment shown in FIG. 2 can be applied to the apparatus 100 shown in FIG. 1. The method is described as follows.

In Step 910, the controller 114 is arranged to provide a plurality of entropy slices with a causal criterion on processing order.

In Step 920, under control of the controller 114, the processing elements 112-1, 112-2, . . . , and 112-Z respectively start to perform a coding procedure for the plurality of entropy slices according to the causal criterion, so that a number of the entropy slices are processed in parallel.

More specifically, under control of the controller 114, the processing elements 112-1, 112-2, . . . , and 112-Z respectively start to perform a coding procedure for the entropy slices according to the causal criterion, so that a number of entropy slices are processed in parallel. In particular, when Z (i.e. the number of processing elements) is equal to or greater than the number of entropy slices, the number of entropy slices processed in parallel can be extended to all of the entropy slices assuming that the last processing element starts processing before the first processing element finishes processing.

According to this embodiment, the apparatus 100 is capable of utilizing one or more predetermined delay amounts to control intervals between start time points of the coding procedure of some or all of the entropy slices. For example, a picture comprises a first entropy slice and a second entropy slice, the second entropy slice is positioned below the first entropy slice. The apparatus 100 of this embodiment controls an interval between a start time point of the coding procedure of the first entropy slice and a start time point of the coding procedure of the second entropy slice based on a predetermined delay amount, where the predetermined delay amount corresponds to the causal criterion.

Figure 3:
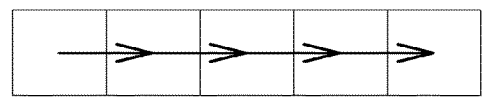
FIG. 3 illustrates exemplary processing orders of macroblocks (MBs) corresponding to different values of an entropy slice height according to different special cases of the embodiment shown in FIG. 2.
Figure 3:
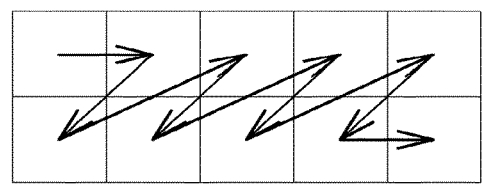
Figure 3:
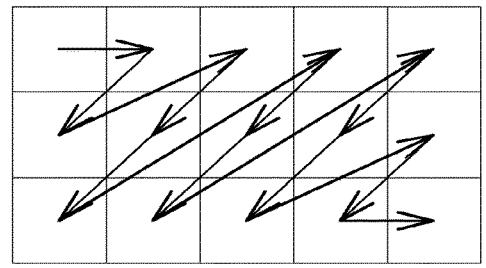

FIG. 3 illustrates exemplary processing orders of MBs corresponding to different entropy slice heights according to different cases of the embodiment shown in FIG. 2, where the respective squares shown in FIG. 3 represent MBs. For example, the entropy slice height H is measured in terms of number of MB(s), and H is a positive integer. According to a first case, given that H=1, an exemplary processing order of MBs within an entropy slice is illustrated on the top of FIG. 3, where the left-most MB is the first MB to be processed within this entropy slice and the processing order is from left to right. According to a second case, given that H=2, an exemplary processing order of MBs within an entropy slice is then illustrated subsequently, where the left-most MB of the first MB row is the first MB to be processed within this entropy slice, then the second to left MB of the first MB row and the left-most MB of the second MB row are the second and third MBs to be processed, respectively. According to a third case, given that H=3, an exemplary processing order of MBs within an entropy slice is also illustrated, where the left-most MB of the first MB row is the first MB to be processed within this entropy slice.

In some cases of the embodiment shown in FIG. 2 (e.g. the second and the third cases mentioned above), the entropy slice height is equivalent to a height of a plurality of MBs, and during processing of each entropy slice the apparatus 100 utilizes a serial of zigzag MB location transitions within the entropy slice to respectively process MBs of the entropy slice.

In general, in this embodiment, the left-most MB $MB_{[0,\,0]}$ of the first MB row of the same entropy slice is the first MB to be processed within the entropy slice. The second left-most MB $MB_{[1,\,0]}$ of the first MB row of the same entropy slice is the second MB to be processed within the entropy slice. Given that a current MB, $MB[x_n, y_n]$ is under processing, the MB index $[x_{n+1}, y_{n+1}]$ of the next MB can be expressed as follows:

$$[x_{n+1}, y_{n+1}] = [(y_n == (H-1))?(x_n + H):(x_n - 1), (y_n == (H-1))?(0):(y_n + 1)];$$

where when the MB location indicated by the MB index $[x_{n+1}, y_{n+1}]$ represents an MB location outside the entropy slice, this MB location is bypassed and next iterations are performed until $[x_{n+1}, y_{n+1}]$ is inside the entropy slice. As a result, a proper MB location within the entropy slice border can be obtained during the subsequent iteration(s).

According to different variations of this embodiment, the predetermined delay amount can be associated to various time dependencies, and proposal A and proposal B are provided in the following description as two examples. Here, an embodiment of the predetermined delay amount associated to proposal A corresponds to a processing time of $D_A$ MB(s), where $D_A$ is obtained according to the following equation:

$$D_A = 1 + 2 + \ldots + (H-1) + H.$$

This equation determines the minimum amount of delay, so any amount of delay greater than or equal to the processing time of $D_A$ MB(s) can be used as the predetermined delay amount.

In addition, the predetermined delay amount associated to proposal B corresponds to a processing time of $D_B$ MBs, where $D_B$ is obtained according to the following equation:

$$D_B=(1+2+\ldots+(H-1)+H)+H.$$

Please note that, for the first case mentioned above, given that H=1, $D_A$=1 and $D_B$=2. For the second case mentioned above, given that H=2, $D_A$=3 and $D_B$=5. For the third case mentioned above, given that H=3, $D_A$=6 and $D_B$=9.

Figure 4:
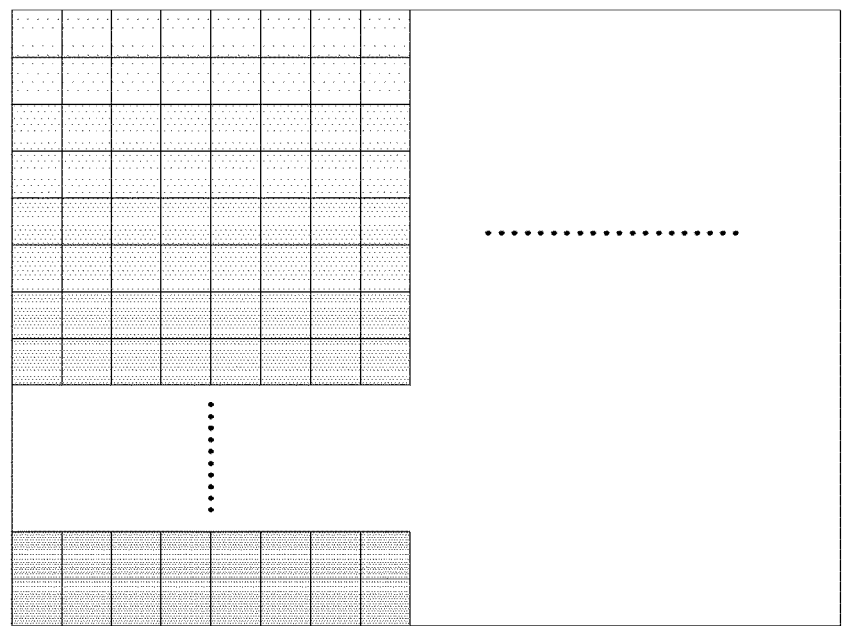
FIG. 4 illustrates exemplary entropy slices according to a special case of the embodiment shown in FIG. 2.

FIG. 4 illustrates exemplary entropy slices in a video picture, where MBs shaded with the same density of dotted patterns are within the same entropy slice, and H=2. Please note that although entropy slices are exactly one MB row or integer multiples of MB rows in above examples, they can contain fractional MB row. For example, let each entropy slice comprise two and half MB rows, and let each MB row have more than four MBs. In this case, the equation for expressing the aforementioned MB index [$x_{n+1}$, $y_{n+1}$] of the next MB is still valid, but some modifications have to be done as follows. For the first entropy slice, H is set to 3, the first MB is [0, 0], the second MB is [1, 0], and iterations are applied to obtain the order of every MB in the first slice. For the second entropy slice, H is set to 3, the first MB is [0, 3], the second MB is [1, 3], and iterations are applied to obtain the order of every MB in the second slice. Even if the shape of an entropy slice is not rectangular, the value of computed [$x_{n+1}$, $y_{n+1}$] is still valid as long as it is inside the same entropy slice.

Figure 5:
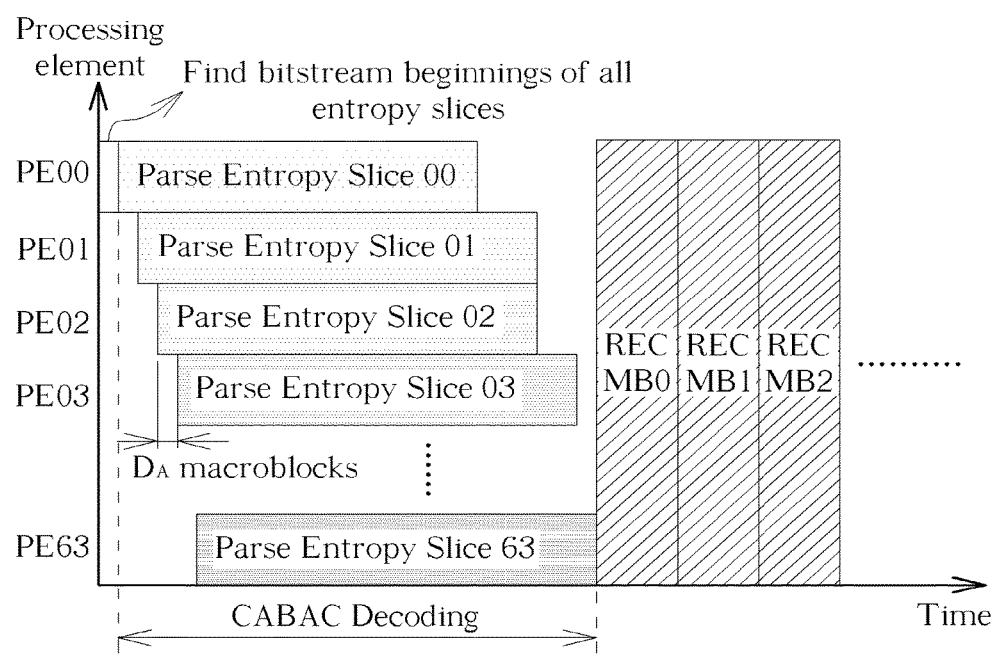
FIG. 5 illustrates an exemplary timing diagram of procedures performed by a decoder, where 64 processing elements are utilized for decoding 64 entropy slices.

FIG. 5 illustrates an exemplary timing diagram of parallel video decoding according to an embodiment, where 64 processing elements (e.g. PE00, PE01, PE02, PE03, . . . , and PE63) are utilized for decoding 64 entropy slices (e.g. the entropy slices 00, 01, 02, 03, . . . , and 63). The operations labeled "REC MB0", "REC MB1", "REC MB2", . . . , etc. represent decoding operations of MB0, MB1, MB2, . . . , etc., respectively, where "REC" stands for reconstruction and may include one or a combination of motion compensation, intra prediction, inverse quantization, inverse transform, and sample reconstruction. The predetermined delay amount corresponding to the processing time of $D_A$ MBs is applied to the control of the start time points.

The causal criterion of an embodiment in proposal A ensures that before processing each MB, its upper MB (if exists) and its left MB (if exists) have been parsed by CABAC. For example, a specific MB of entropy slice 03 has an upper MB positioned within entropy slice 02. Under the control of the controller 114, the specific MB is processed after its upper MB is parsed by CABAC.

The causal criterion of an embodiment in proposal B ensures that before processing each MB, its upper left MB (if exists), its upper MB (if exists), its upper right MB (if exists), and its left MB (if exists) have been fully reconstructed. For example, suppose that the specific MB of entropy slice 03 has an upper left MB, an upper MB, and an upper-right MB positioned within entropy slice 02, and a left MB positioned within entropy slice 03. Under the control of the controller 114, the specific MB is processed after the upper left MB, the upper MB, the upper right MB, and the left MB are reconstructed. Please recall that the proposed zigzag order shown in FIG. 2 can satisfy the causal criteria of both proposal A and proposal B for all MBs within an entropy slice. The zigzag order is also designed to minimize the idle time of MBs on the first row of an entropy slice waiting for their upper MBs on the last row of its previous entropy slice.

According to timing diagram shown in FIG. 5, when decoding a specific MB, the apparatus 100 ensures that the upper MB (if exists) of the specific MB and the left MB (if exists) of the specific MB have already been parsed. Please note that CABAC parsing of an MB requires its left MB and its upper MB. In this embodiment, intra prediction, motion vector prediction, and CABAC context formation are allowed across entropy slices. Only context initialization may cause compression efficiency loss.

Note that the CABAC processing duration for each MB in an entropy slice may be different, for example, although the timing diagram of FIG. 5 shows CABAC decoding for MBs in each entropy slice is consecutive in time, some MBs may still have to wait until corresponding upper MBs in the above entropy slice have been parsed in order to comply with the causal criterion. It is also true for CABAC encoding.

According to this embodiment, the target of a high degree of parallelism can be approached. Although a delay depending on sizes of pictures and shapes of entropy slices is introduced when the causal criterion is applied, the present invention method and apparatus indeed alleviate the related art problem of losing compression efficiency in comparison with the conventional sequential CABAC. In the case when latency is considered as a major concern, it is preferred to set H=1 to decrease the delay.

Figure 6:
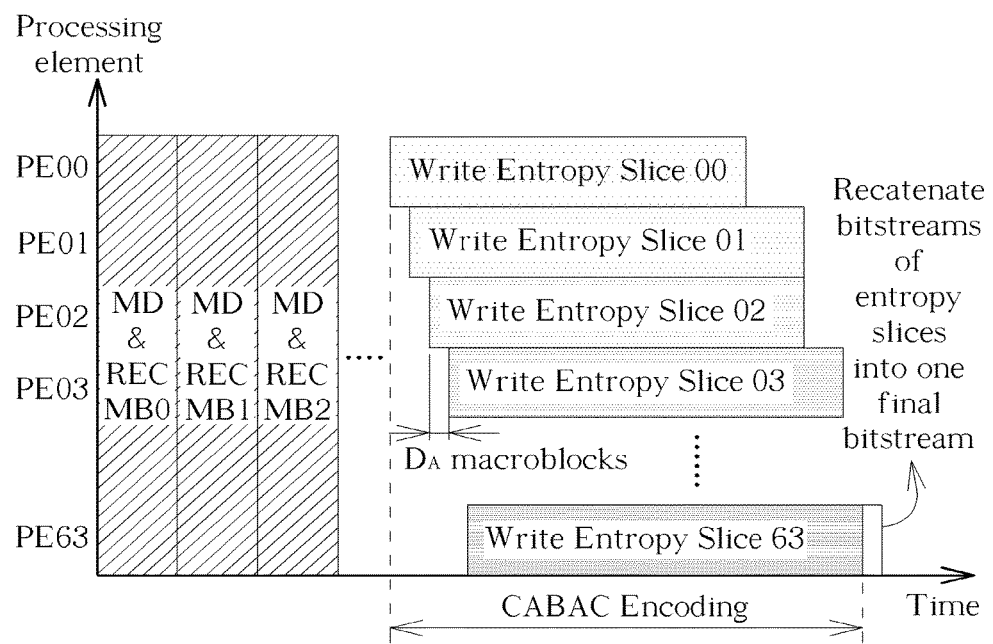
FIG. 6 illustrates an exemplary timing diagram of procedures performed by an encoder, where 64 processing elements are utilized for encoding 64 entropy slices.

FIG. 6 illustrates an exemplary timing diagram of parallel video encoding according to an embodiment, where 64 processing elements (e.g. PE00, PE01, PE02, PE03, . . . , and PE63) are utilized for encoding 64 entropy slices (e.g. the entropy slices 00, 01, 02, 03, . . . , and 63). The operations labeled "MD & REC MB0", "MD & REC MB1", "MD & REC MB2", . . . , etc. represent encoding operations of MB0, MB1, MB2, . . . , etc., respectively, where "MD" stands for mode decision, "REC" stands for reconstruction, and "MD & REC" may include one or a combination of motion estimation, motion compensation, intra prediction, transform, quantization, inverse quantization, inverse transform, rate-distortion optimized mode decision, and sample reconstruction. The predetermined delay amount corresponding to the processing time of $D_A$ MBs is applied to the control of the start time points.

Figure 7:
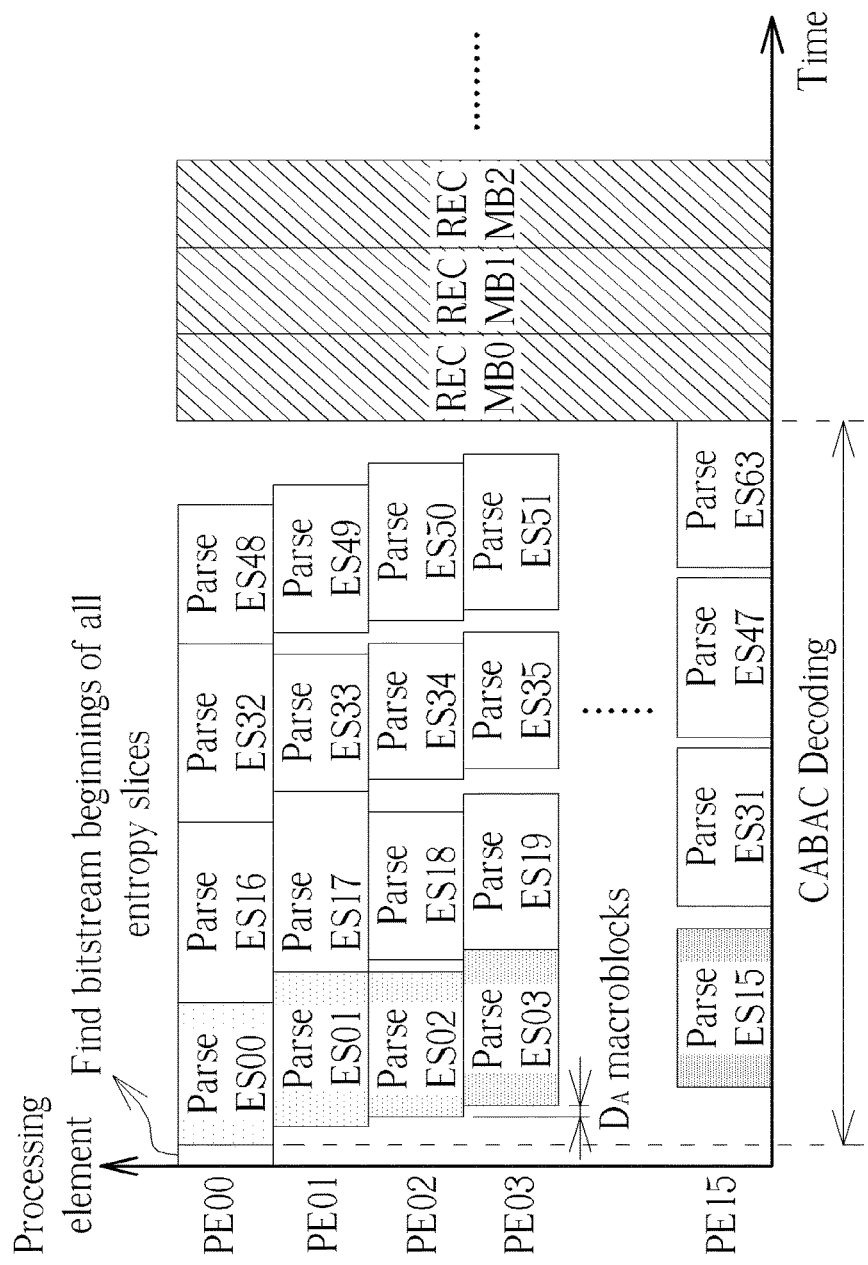
FIG. 7 illustrates an exemplary timing diagram of procedures performed by a decoder, where 16 processing elements are utilized for decoding 64 entropy slices.

FIG. 7 illustrates an exemplary timing diagram of parallel video decoding according to another embodiment, where 16 processing elements (e.g. PE00, PE01, PE02, PE03, . . . , and PE15) are utilized for decoding 64 entropy slices (e.g. the entropy slices ES00, ES01, ES02, ES03, . . . , and ES63). Each processing element is responsible for a number of entropy slices, and it is not limited to assign the same amount of entropy slices to each processing element as shown in FIG. 7. The predetermined delay amount corresponding to the processing time of $D_A$ MBs is applied to the control of the start time points. For example, before the apparatus 100 starts to parse a current entropy slice (e.g. entropy slice ES03), $D_A$ MBs of the previous entropy slice thereof (e.g. entropy slice ES02) have been parsed.

Figure 8:
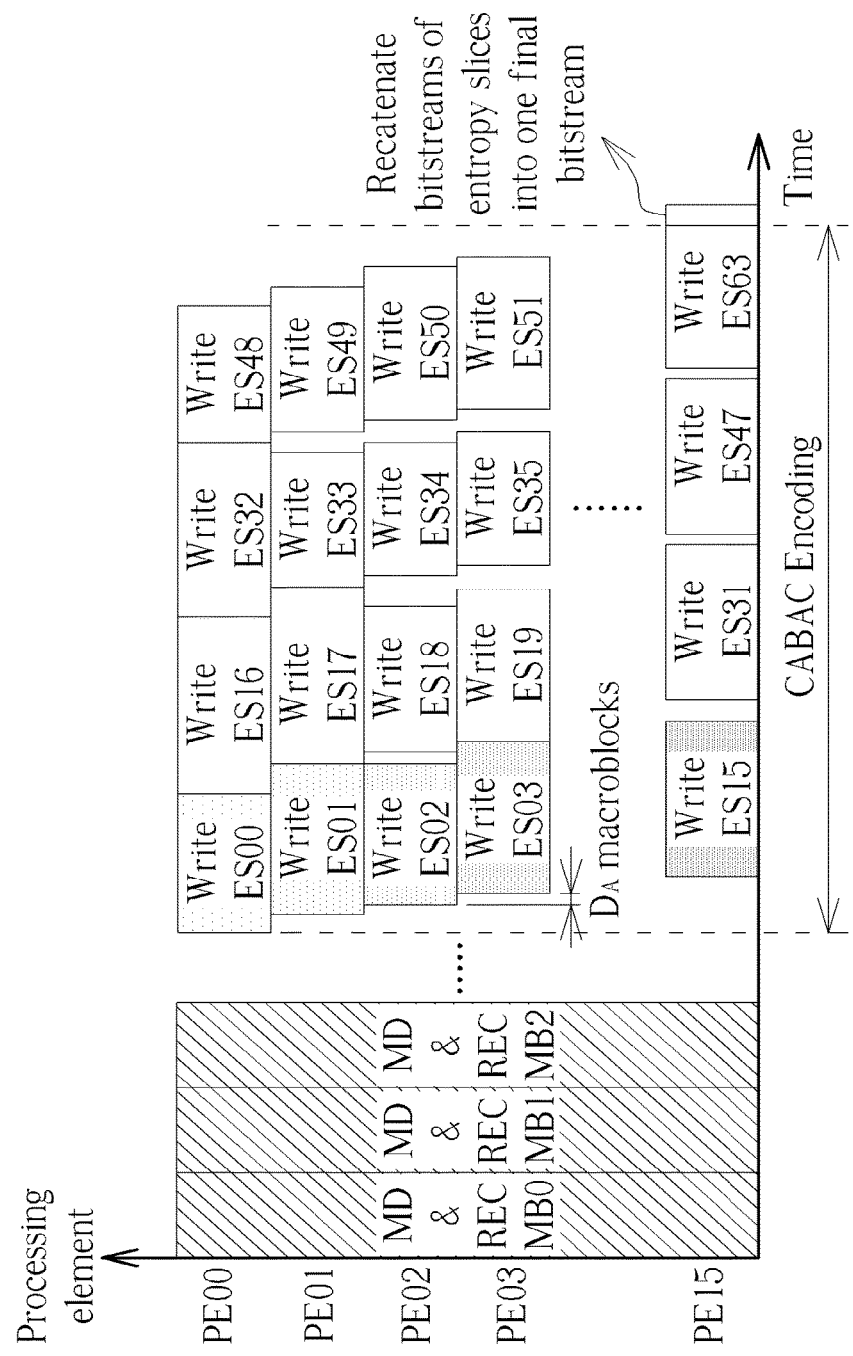
FIG. 8 illustrates an exemplary timing diagram of procedures performed by en encoder, where 16 processing elements are utilized for encoding 64 entropy slices.

FIG. 8 illustrates an exemplary timing diagram of parallel video encoding according to another embodiment, where 16 processing elements (e.g. PE00, PE01, PE02, PE03, . . . , and PE15) are utilized for encoding 64 entropy slices (e.g. the entropy slices ES00, ES01, ES02, ES03, . . . , and ES63). The predetermined delay amount corresponding to the processing time of $D_A$ MBs is applied to the control of the start time points. As a result, before the apparatus 100 starts to write a current entropy slice (e.g. entropy slice ES03), $D_A$ MBs of the previous entropy slice thereof (e.g. entropy slice ES02) have been written.

According to the embodiments/variations corresponding to the proposal A, the present invention method and apparatus can support intra prediction, motion vector prediction, and context formation across entropy slices to enhance compression ability. Although a longer decoding/encoding latency is introduced, the latency overhead is a small percentage of the overall latency when the number of processing elements (i.e. the processing element count Z) is smaller than the entropy slice count n(ES) (e.g. Z=16 and n(ES)=64). However, a picture-level buffer is still required to store prediction residues and motion vector differences.

According to a variation of the embodiments disclosed above, each entropy slice can be initialized as CABAC states of a previous entropy slice after coding $D_A$ MBs. In another variation, each entropy slice can be initialized as predefined CABAC states. In some embodiments, each illustrated write operation (e.g. those labeled "Write Entropy Slices . . . " or "Write ES . . . ") corresponding to proposal A can be started as long as a processing element is available without any delay of $D_A$ MBs because required information of neighboring MBs for each MB has been obtained during mode decision and reconstruction.

Figure 9:
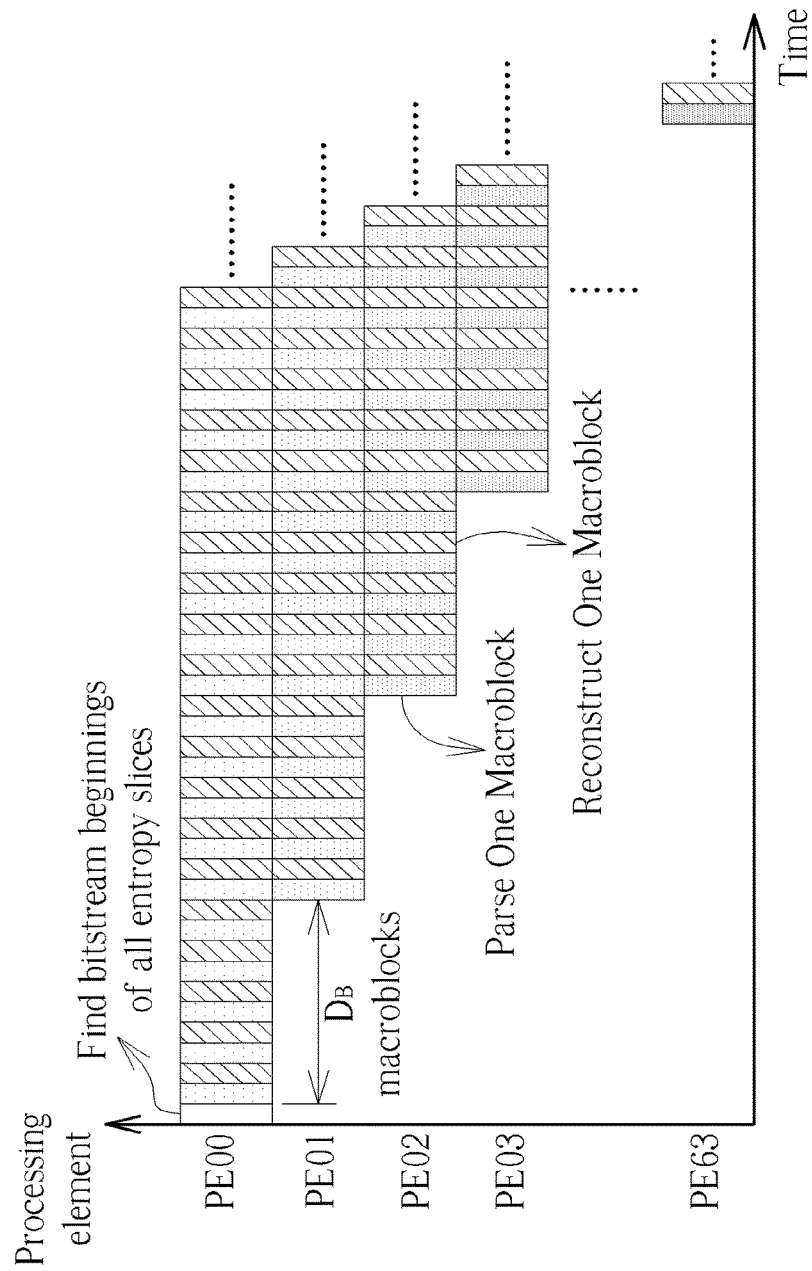
FIG. 9 illustrates an exemplary timing diagram of procedures performed by a decoder, where 64 processing elements are utilized for decoding 64 entropy slices.

FIG. 9 illustrates an exemplary timing diagram of parallel video decoding according to a variation of proposal B, where 64 processing elements (e.g. PE00, PE01, PE02, PE03, . . . , and PE63) are utilized for decoding 64 entropy slices (e.g. entropy slices ES00, ES01, ES02, ES03, . . . , and ES63). In this embodiment, each processing element parses and reconstructs an MB successively, and a predetermined delay amount corresponding to the processing time of $D_B$ MBs is applied to the control of the start time points.

According to the timing diagram shown in FIG. 9, when decoding a specific MB, the apparatus 100 complies with the causal criterion, which ensures that the upper left MB (if exists), the upper MB (if exists), the upper right MB (if exists), and the left MB (if exists) have already been parsed and reconstructed. Please note that full reconstruction of an MB requires its left MB, its upper-left MB, its upper MB, and its upper-right MB. In this embodiment, intra prediction, motion vector prediction, and CABAC context formation are allowed across entropy slices.

Similarly, the target of a high degree of parallelism can be achieved. Although a delay depending on sizes of pictures and shapes of entropy slices is introduced, the present invention method and apparatus indeed solve the related art problems such as high memory cost, the off-chip memory access bottleneck, and the loss of compression efficiency. For shorter latency, it is preferred to set H=1 to decrease the delay. Please recall that the picture-level memory for storing prediction residues and motion vector differences is caused by the mismatch of processing orders between CABAC and reconstruction. In FIG. 9, the processing order of CABAC is the same as that of reconstruction, which implies the parsed MB information of a current MB will be used for reconstructing subsequent MBs in a relatively short time. Therefore, the required memory size is only at MB level, so an on-chip memory can be adopted.

Figure 10:
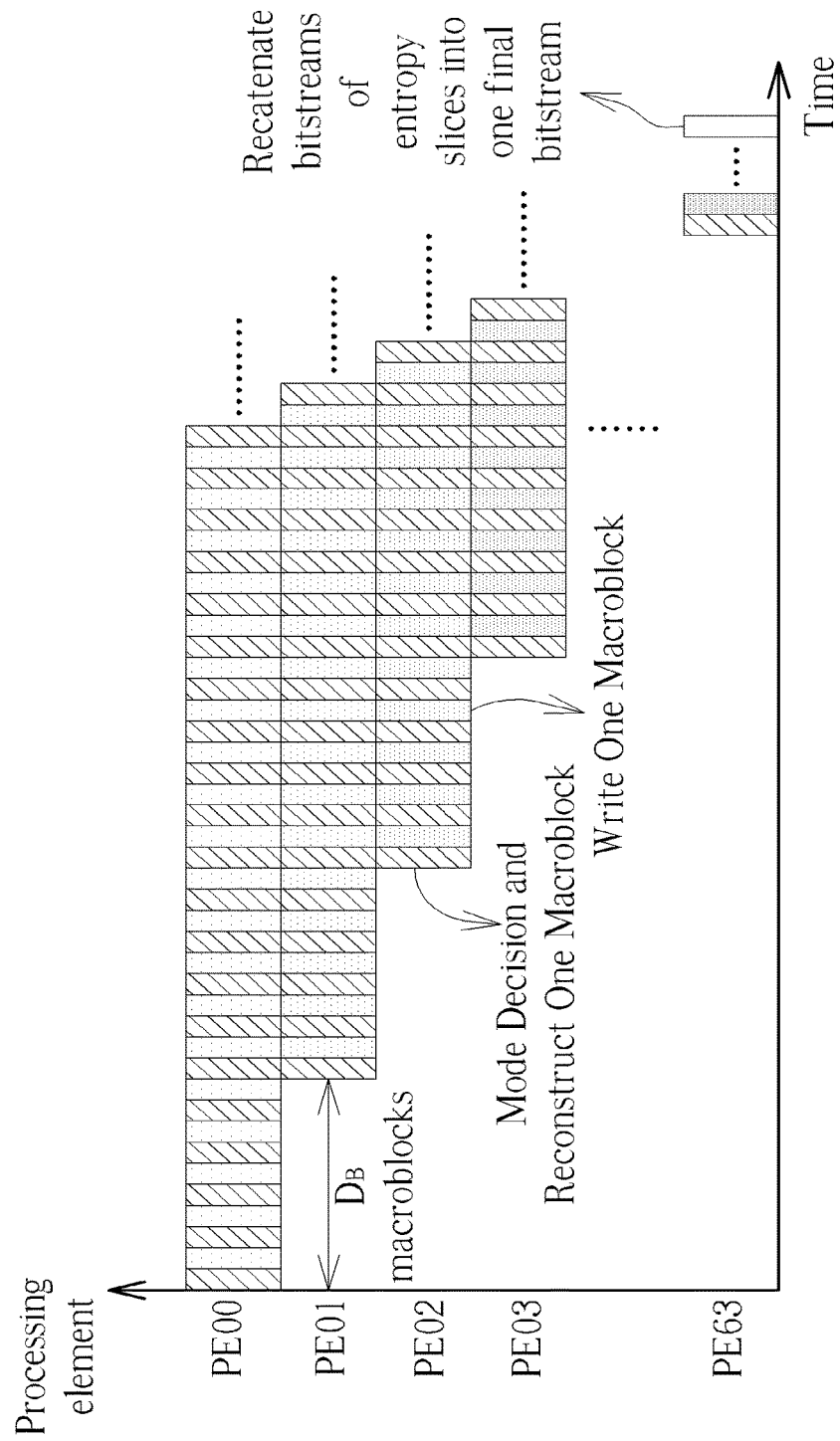
FIG. 10 illustrates an exemplary timing diagram of procedures performed by an encoder, where 64 processing elements are utilized for encoding 64 entropy slices.

FIG. 10 illustrates an exemplary timing diagram of parallel video encoding, where 64 processing elements (e.g. PE00, PE01, PE02, PE03, . . . , and PE63) are utilized for encoding 64 entropy slices (e.g. entropy slices ES00, ES01, ES02, ES03, . . . , and ES63). The predetermined delay amount corresponding to the processing time of $D_B$ MBs is applied to the control of the start time points.

Figure 11:
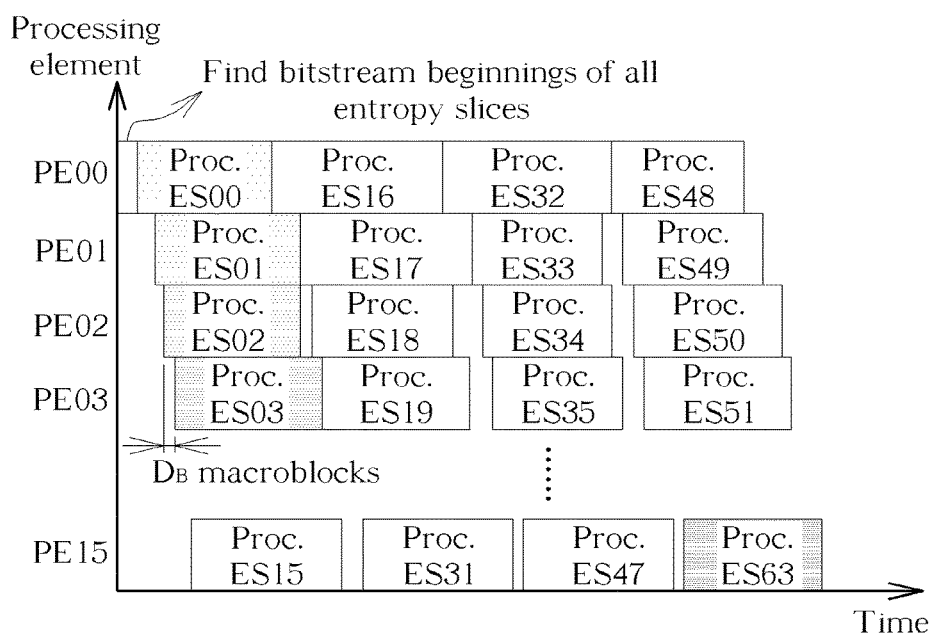
FIG. 11 illustrates an exemplary timing diagram of procedures performed by a decoder, where 16 processing elements are utilized for decoding 64 entropy slices.

FIG. 11 illustrates an exemplary timing diagram of parallel video decoding according to a variation of the embodiment shown in FIG. 9, where 16 processing elements (e.g. PE00, PE01, PE02, PE03, . . . , and PE15) are utilized for decoding 64 entropy slices (e.g. entropy slices ES00, ES01, ES02, ES03, . . . , and ES63). The operations labeled "Proc. ES . . . " stands for processing an entropy slice "ES . . . ", for example including parsing and reconstructing each MB in the entropy slice MB by MB. The predetermined delay amount corresponding to the processing time of $D_B$ MBs is applied to the control of the start time points. For example, before the apparatus 100 starts to process a current entropy slice (e.g. entropy slice ES03), $D_B$ MBs of the previous entropy slice thereof (e.g. entropy slice ES02) have been processed.

Figure 12:
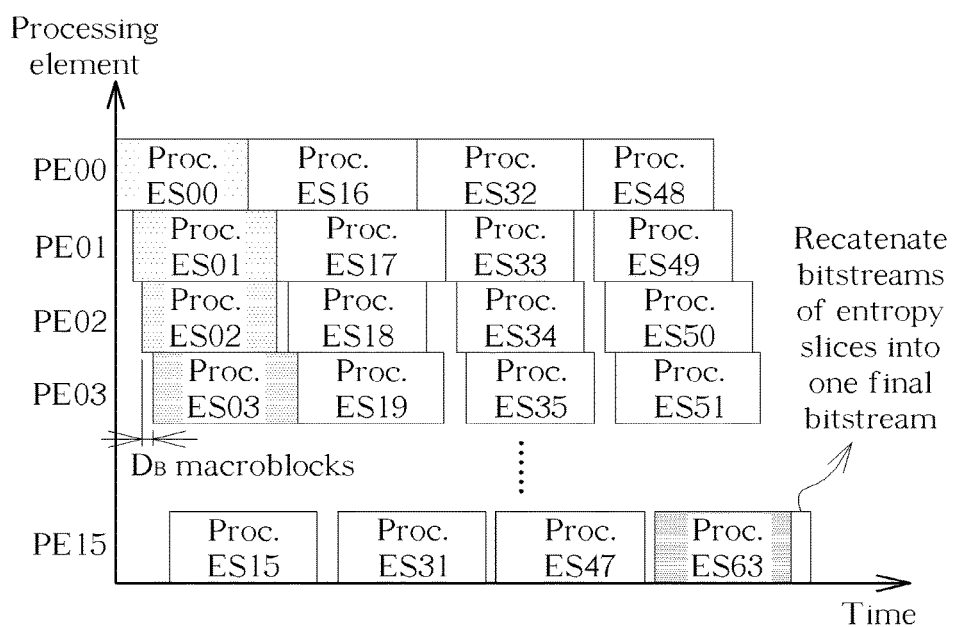
FIG. 12 illustrates an exemplary timing diagram of procedures performed by an encoder, where 16 processing elements are utilized for encoding 64 entropy slices.

FIG. 12 illustrates an exemplary timing diagram of parallel video encoding according to a variation of the embodiment shown in FIG. 10, where 16 processing elements (e.g. PE00, PE01, PE02, PE03, . . . , and PE15) are utilized for encoding 64 entropy slices (e.g. entropy slices ES00, ES01, ES02, ES03, . . . , and ES63). The operations labeled "Proc. ES . . . " stands for processing an entropy slice "ES . . . ", for example including mode decision, reconstructing, and writing each MB in the entropy slice MB by MB. The predetermined delay amount corresponding to the processing time of $D_B$ MBs is applied to the control of the start time points. For example, before the apparatus 100 starts to process a current entropy slice (e.g. entropy slice ES03), $D_B$ MBs of the previous entropy slice thereof (e.g. entropy slice ES02) have been processed.

According to the embodiments of proposal B, the present invention method and apparatus can support intra prediction, motion vector prediction, and context formation across entropy slices to enhance coding efficiency by adopting the causal criterion. Although a longer decoding/encoding latency is introduced, the overall latency may still be shorter than conventional methods because less off-chip memory access is required. The latency overhead is a small percentage of the overall latency when the number of processing elements (i.e. the processing element count Z) is smaller than the entropy slice count n(ES) (e.g. Z=16 and n(ES)=64).

In the embodiments corresponding to proposal B, when the number of processing elements is equal to or greater than the number of entropy slices (e.g. Z≥n(ES), only MB-level buffers are required for storing MB information including prediction residues and motion vector differences. In addition, when Z<n(ES), only MB-row-level buffers are required for storing MB information. For example, as shown in FIG. 11 and FIG. 12, the last MB rows of entropy slices 15, 31, and 47 have to be stored and referenced by the first MB rows of entropy slices 16, 32, and 48, respectively.

According to some variations of the embodiments disclosed above, each entropy slice can be initialized as predefined CABAC states, or initialized as the CABAC states of the previous entropy slice after processing $D_B$ MBs of the previous entropy slice.

If the conventional processing order of deblocking is different from the proposed zigzag scan, for example, the raster scan used in H.264, a picture-level buffer is still required to store reconstructed samples due to the mismatch of processing orders between reconstruction and deblocking. In order to reduce this memory overhead, an embodiment of the present invention also modifies the processing order of deblocking to be consistent with the proposed zigzag scan. In this way, "Reconstruct One Macroblock" shown in FIG. 9 and FIG. 10 also includes deblocking operations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing video coding with ordered entropy slices, the method comprising:
providing a plurality of entropy slices within a picture to one or more of a plurality of processing elements, wherein each entropy slice comprises a plurality of blocks; and
starting each of the processing elements to perform a Context-based Adaptive Binary Arithmetic Coding (CABAC) processing of a coding procedure for a corresponding entropy slice;
wherein CABAC states of a current entropy slice is initialized as CABAC states of a previous entropy slice after processing $D_B$ blocks of the previous entropy slice, wherein $D_B$ is a positive integer and is less than a number of blocks in a row of the entropy slice; the plurality of entropy slices is placed to be processed in a specified order into corresponding processing elements within the plurality of processing elements such that the processing comprises at least a CABAC form of entropy coding, and the previous entropy slice and the current entropy slice are processed by different processing elements within the plurality of processing elements in an order such that start times of processing the previous entropy slice and the current entropy slice are different but processing the previous entropy slice and the current entropy slice is still done in parallel; and CABAC processing comprises a plurality of processes and although CABAC start time processing for the previous entropy slice and the current entropy slice is different, a same one of the processes of CABAC processing is done in parallel at the same time during at least a portion of the processing time.

2. The method of claim 1, wherein the current entropy slice is positioned below the previous entropy slice in the picture.

3. The method of claim 1, wherein the entropy slice has a height of H block(s), H is a positive integer; and $D_B$ is obtained according to the following equation:

$$D_B=1+2+\ldots+(H-1)+H.$$

4. The method of claim 1, wherein the entropy slice has a height of H block(s), H is a positive integer; and $D_B$ is obtained according to the following equation:

$$D_B=(1+2+\ldots+(H-1)+H)+H.$$

5. The method of claim 1, wherein initializing as the CABAC states of the previous entropy slice after processing $D_B$ blocks of the previous entropy slice ensures that each block is processed after an upper block if exists and a left block if exists are processed.

6. The method of claim 1, wherein initializing as the CABAC states of the previous entropy slice after processing $D_B$ blocks of the previous entropy slice ensures that each block is processed after an upper left block if exists, an upper block if exists, an upper right block if exists, and a left block if exists are processed.

7. The method of claim 1, wherein $D_B$ is 2.

8. An apparatus for performing video coding with ordered entropy slices, the apparatus comprising:
a plurality of processing elements, wherein one or more of the plurality of processing elements are arranged to process a plurality of entropy slices within a picture, wherein each entropy slice comprises a plurality of blocks; and
a controller arranged to provide the entropy slices to the one or more of the plurality of processing elements;
wherein under control of the controller, the one or more of the plurality of processing elements start to perform a Context-based Adaptive Binary Arithmetic Coding (CABAC) processing of a coding procedure for the entropy slices, wherein CABAC states of a current entropy slice is initialized as CABAC states of a previous entropy slice after processing $D_B$ blocks of the previous entropy slice, and $D_B$ is a positive integer and is less than a number of blocks in a row of the entropy slice; the plurality of entropy slices is placed to be processed in a specified order into corresponding processing elements within the plurality of processing elements such that the processing comprises at least a CABAC form of entropy coding, and the previous entropy slice and the current entropy slice are processed by different processing elements within the plurality of processing elements in an order such that start times of processing the previous entropy slice and the current entropy slice are different but processing the previous entropy slice and the current entropy slice is still done in parallel; and CABAC processing comprises a plurality of processes and although CABAC start time processing for the previous entropy slice and the current entropy slice is different, a same one of the processes of CABAC processing is done in parallel at the same time during at least a portion of the processing time.

9. The apparatus of claim 8, wherein the current entropy slice is positioned below the previous entropy slice in the picture.

10. The apparatus of claim 8, wherein the entropy slice has a height of H block(s), H is a positive integer; and $D_B$ is obtained according to the following equation:

$$D_B=1+2+\ldots+(H-1)+H.$$

11. The apparatus of claim 8, wherein the entropy slice has a height of H block(s), H is a positive integer; and $D_B$ is obtained according to the following equation:

$$D_B=(1+2+\ldots+(H-1)+H)+H.$$

12. The apparatus of claim 8, wherein initializing as the CABAC states of the previous entropy slice after processing $D_B$ blocks of the previous entropy slice ensures that each block is processed after an upper block if exists and a left block if exists are processed.

13. The apparatus of claim 8, wherein initializing as the CABAC states of the previous entropy slice after processing $D_B$ blocks of the previous entropy slice ensures that each block is processed after an upper left block if exists, an upper block if exists, an upper right block if exists, and a left block if exists are processed.

14. The apparatus of claim 8, wherein $D_B$ is 2.

* * * * *